United States Patent [19]

Jauch

[11] 4,027,241

[45] May 31, 1977

[54] SOLID STATE WATT AND VAR TRANSDUCER

[75] Inventor: Jeremy P. Jauch, Kearny, N.J.

[73] Assignee: Westinghouse Electric Corporation, Pittsburgh, Pa.

[22] Filed: May 19, 1976

[21] Appl. No.: 687,837

[52] U.S. Cl. ............................................... 324/142
[51] Int. Cl.² ................................................ G01R 21/06
[58] Field of Search ............ 324/142, 141; 235/194

[56] References Cited

UNITED STATES PATENTS

| 3,500,200 | 3/1970 | Woodhead | 324/142 |
| 3,818,340 | 6/1974 | Yamaguchi | 324/142 |
| 3,953,795 | 4/1976 | Brunner et al. | 324/142 |
| 3,955,138 | 5/1976 | Milkovic | 324/142 X |
| 3,976,942 | 8/1976 | Mayfield | 324/142 |

Primary Examiner—Stanley T. Krawczewicz
Attorney, Agent, or Firm—S. A. Seinberg

[57] ABSTRACT

This application discloses a solid state high output watt transducer which utilizes the pulse width-pulse height multiplication principle and comprises digital integrated circuits for obtaining a direct current output which is proportioned to watts.

16 Claims, 8 Drawing Figures

SOLID STATE WATT AND VAR TRANSDUCER

BACKGROUND OF AND SUMMARY OF THE INVENTION

Wattmeters utilizing an amplitude and width modulated pulse train are known to the art. One example of such a wattmeter is described in U.S. Pat. No. 3,500,200 to P. Woodhead and which issued Mar. 10, 1970. The construction of the transducer of this application represents an improved structure which eliminates the necessity of providing a zero adjustment, and which may be calibrated by changing the amplitude of its generated triangular wave. Since the triangular wave generator is common to all of the watt sensing networks, the utilization of this type of calibration eliminates the need for independently calibrating each watt sensing network. Other advantages will be apparent to those skilled in the art.

DESCRIPTION OF THE PREFERRED EMBODIMENT

Figure 1:
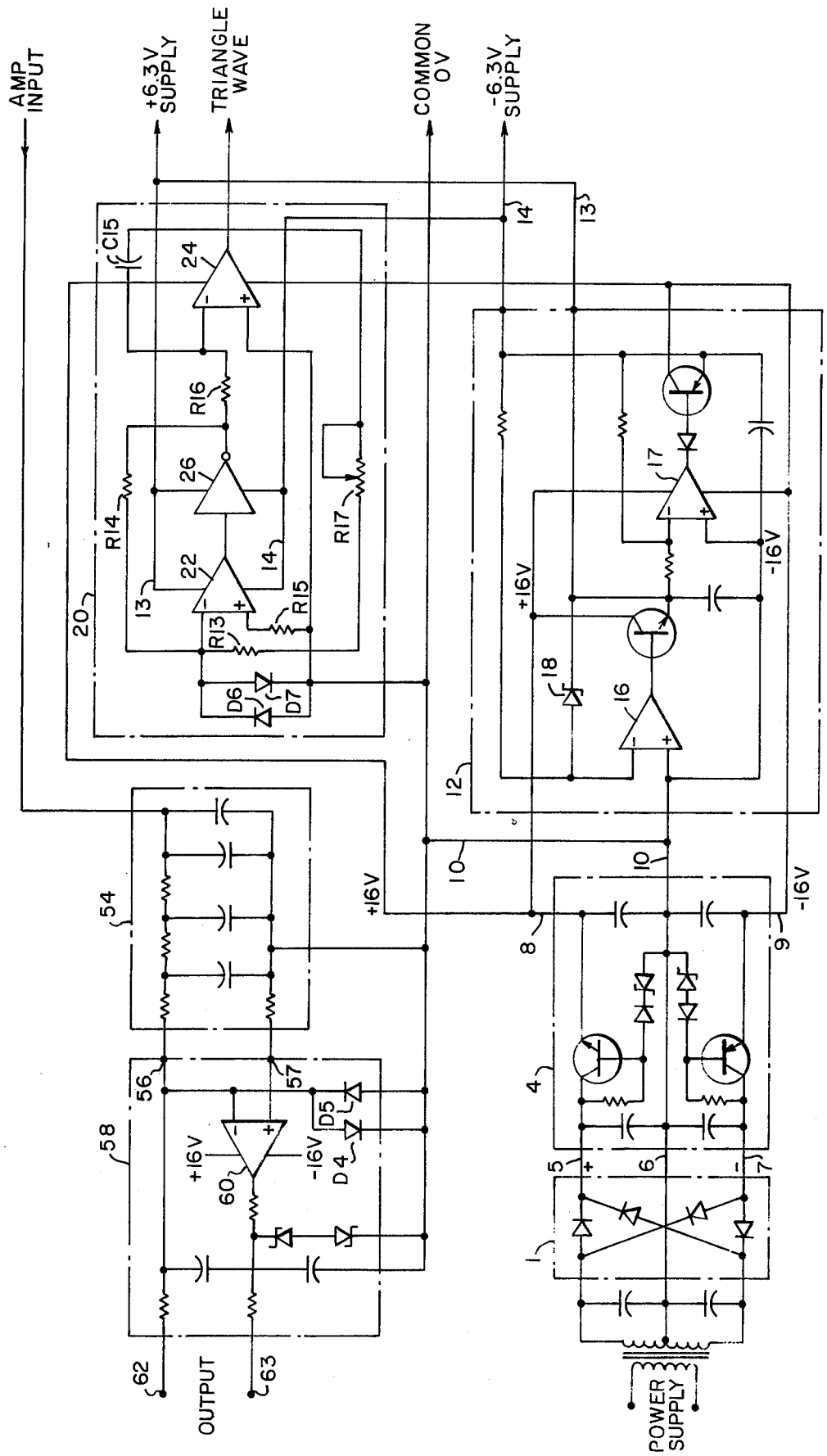
FIGS. 1 and 2 when combined provide a block diagram of a watt transducer embodying the invention; and, FIGS. 3–8 are curves useful in understanding the invention.

Referring to the drawings by characters of reference, the numeral 1 (FIG. 1) designates a rectifying network energized from a suitable alternating potential power supply (not shown) through a center tapped transformer 2. A first potential regulator 4 is energized from the positive, neutral and negative output conductors 5, 6 and 7 of the network 1 and by means of suitable transistors and zener diodes provides a regulated +16V, −16V and OV outputs on its output conductors 8, 9 and 10. A second potential regulator 12 provides +6.3 volts and −6.3 volts (with respect to conductor 10) on its output conductors 13 and 14. The low voltage output of the regulator 12 is precisely regulated by operational amplifiers 16 and 17 and referenced to a temperature compensated zener diode 18.

Figure 4:
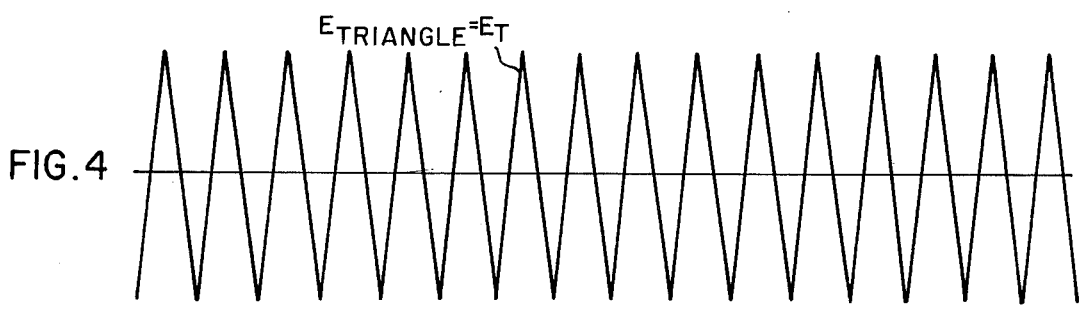
Figure 5:
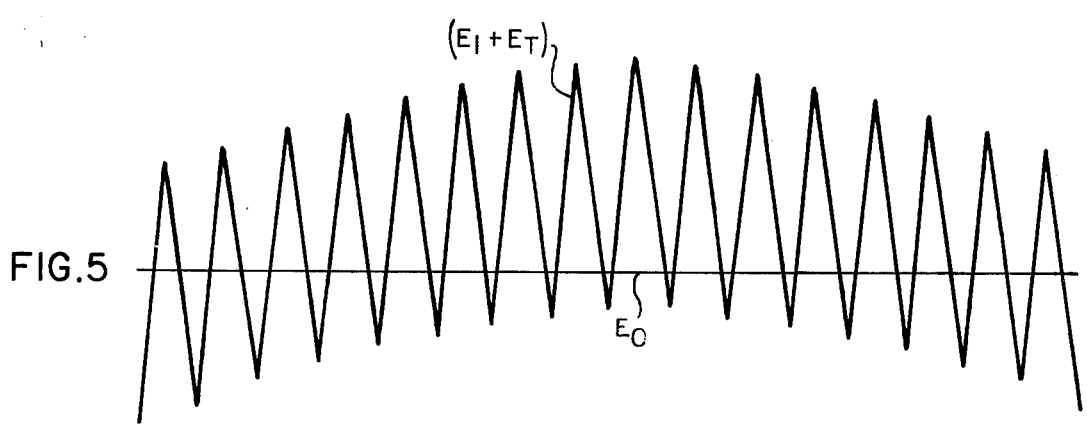

A triangular wave generator 20 comprises first and second operational amplifiers 22 and 24 and an inverter 26. The negative input terminal of amplifier 22 is connected to the neutral bus or conductor 10 by a pair of antiparallelly arranged diodes D6 and D7 to prevent an excessive diffential voltage at the input terminals of the amplifier 22. The positive input terminal is referenced with respect to the bus 10 through a resistor R15. The output terminal of the amplifier 22 is connected to the input terminal of the inverter 26. The output terminal of the inverter 26 is connected through a resistor R16 to the negative input terminal of the amplifier 24 and connected through a resistor R14 to the negative input terminal of the amplifier 22. The output terminal of the amplifier 24 is connected through a capacitor C15 to its negative input terminal and is connected to the negative input terminal of the amplifier 22 through a fixed resistor R13 and an adjustable resistor R17. The positive potential and negative potential power input terminals of the amplifier 22 and of the inverter 26 are connected to the positive and negative conductors or busses 13 and 14 respectively. The positive and negative potential power input terminals of amplifier 24 are connected to busses 8 and 9 respectively. The generator 20 provides a precisely regulated triangular wave $E_T$ (FIG. 4), the amplitude of which is calibrated by the adjustment of the resistor R17. As will be made clear below, this adjustment calibrates the magnitude of the direct current output of the transducer with respect to the power (watts) being measured thereby.

Figure 2:
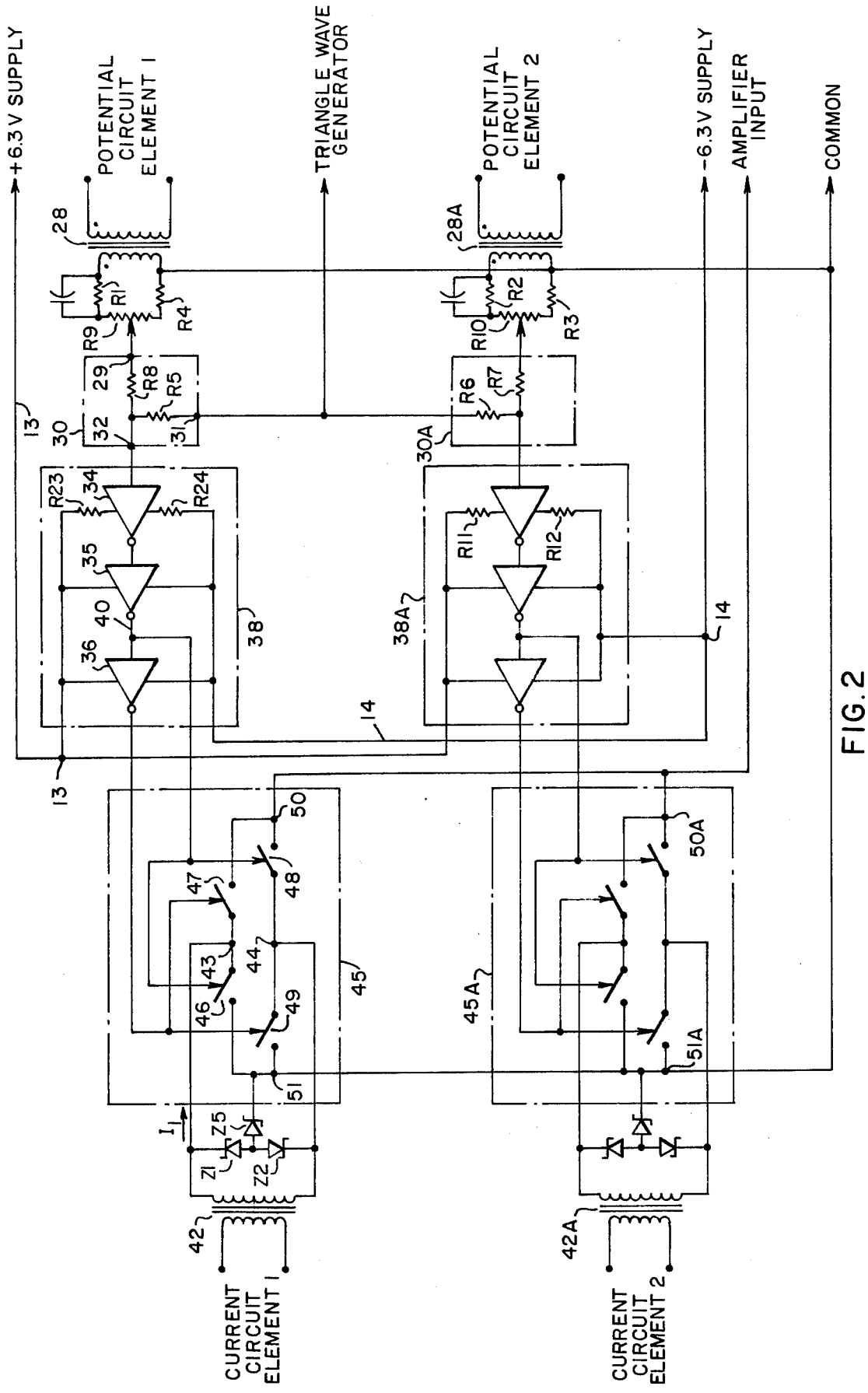
Figure 3:
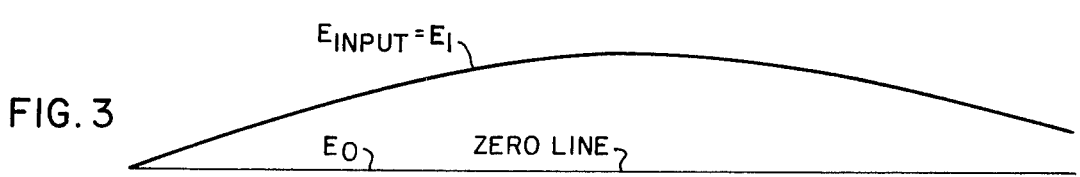

The potential of the power being measured by the transducer is supplied to a potential transformer 28 (FIG. 2). The output potential of this transformer 28 is referenced to the potential $E_0$ of the neutral or common bus 10 by having one terminal of its secondary winding directly connected thereto. A potential dividing network comprising the fixed resistors R1 and R4 and the potentiometer R9 is connected across the secondary of transformer 28. The desired proportion of this voltage $E_1$ is supplied from the movable contact of the potentiometer R9 to one input 29 of a summing network 30. The other input terminal 31 is connected to the output terminal of the triangular wave generator 20, which provides the voltage $E_T$.

The output terminal 32 of the summing network 30 is connected to the input terminal of a first inverter 34 of a plurality of inverters 34, 35 and 36 of the comparator network 38 and supplies the voltage $(E_1 + E_T)$. The inverter may be the three sections of a CMOS device CD4007AE. The output terminal 39 of the inverter 34 is connected to the input terminal of the inverter 35. The output terminal 40 of the inverter 35 is connected to the input terminal of the inverter 36. The voltage terminals of the inverters 35 and 36 are connected directly to the busses 13 and 14.

The current component of the watts (associated with the voltage component $E_1$ supplied to the potential transformer 28) is supplied to the current transformer 42. A plurality of zener diodes Z1, Z2 and Z5 protect against an overvoltage condition which for example might be caused by an open condition of the current circuit or by current or voltage surges on the current circuit. The current output $I_1$ of the transformer 42 is applied to the input terminals 43 and 44 of a switching circuit 45. The circuit 45 comprises 4 electrically operated switches 46, 47, 48 and 49 having their main circuits connected into a bridge circuit which provides the input terminals at two opposite corners. The other two opposite corners of the bridge circuit provide the output terminals 50 and 51. The actuated switches of the circuit 45 may be the four switches of a CMOS QUAD Bilateral Switch of the CD4016AE type. The control circuits of the switches 46 and 48 are connected to the output terminal of the inverter 35 while the control circuits of the switches 47 and 49 are connected to the output terminal of the inverter 36. With this arrangement the pairs of switches 46-48 and 47-49 alternately conduct under control of the comparator network 38 as determined by the sum of the potentials derived from the triangular wave generator 20 and the voltage component of the measured quantity derived from the potential transformer 28.

Figure 6:
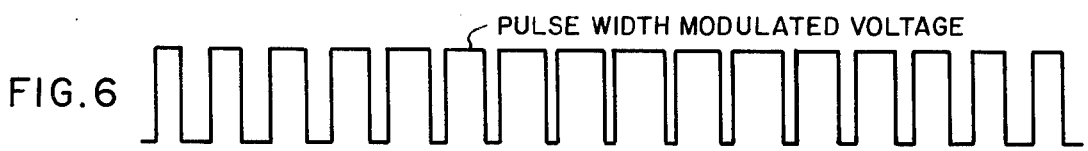
Figure 7:
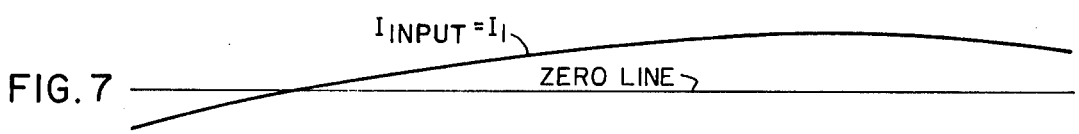
Figure 8:
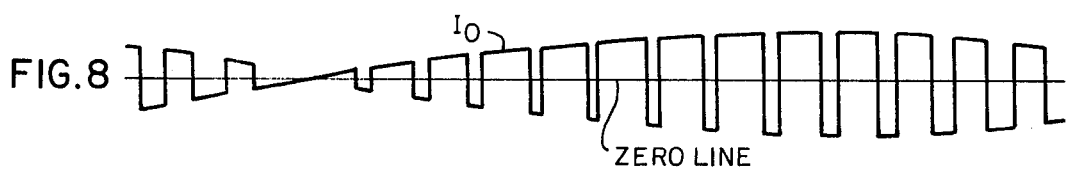

The voltage $(E_1 + E_T)$ supplied to the comparator network 38 is compared with this reference voltage $E_0$ and provides the pulse width modulated voltage of FIG. 6 to the control circuits of one of the pairs of switches 46-48 connected to the output terminal of the inverter 35 and the inverted wave of FIG. 6 to the control circuits of the other of the pairs of switches 47-49 connected to the output terminal of the inverter 36. The resulting alternating conducting condition of the pairs of switches 46-48 and 47-49 provide the $I_0$ output current (FIG. 8) to a filter network 54 tuned to block all frequencies including the second harmonic and above of the output current $I_D$. In this regard it should be noted that the product of any two displaced sine waves of the same frequency may be represented by the equation $$[E\sin(\omega t)][I\sin(\omega t - \theta)]$$

which reduces to
$$EI/2 [(\cos \theta) - \cos(2\omega t - \theta)]$$

preferably, however, because of internal and external influences I have found that to obtain a peak to peak ripple of 1% or less the filter should block all frequencies above 2 or 3 hertz.

Therefore when the second harmonic component $(2\omega t - \theta)$ and the higher harmonics in the pulse train are filtered out, the output of the filter will be $EI/2 \cos \theta$ where $\cos \theta$ is the power factor of the volt amperes being measured and the output of the filter is directly proportional to watts.

The DC output current of the filter 54 is supplied to the positive and negative input terminals 56 and 57 of a current amplifier 58. The amplifier 58 comprises an operational amplifier 60 having its negative input terminal connected to the positive input terminal 56 and its positive input terminal connected to the negative input terminal 57. The output circuit of the amplifier 58 extends from the terminal 56 through the resistor R6, the current load terminals 62 and 63, the resistors R7 and R8 and the operational amplifier and one of its potential terminals connected to the +16 and −16 volt supply.

It will be appreciated that the relationship of the magnitude of the DC output current with respect to the magnitude of the watts being measured may be calibrated by controlling the magnitude of the triangular wave $E_T$. The use of the current amplifier as distinguished from the conversion of the current to a voltage eliminates the necessity for a zero or null adjustment.

As described above, the wattmeter measures the watts represented by the current $I_1$ and voltage $E_1$. In many instances, as for example in a three wire system, it may be desirable to add additional wattage determining units, as for example the potential transformer 28A, the summing network 30A, the comparator network 38A, the switching circuit 45A, and the current transformer 42A. Since the total watts are to be measured the output terminals 50A and 51A may be connected in parallel with the output terminals 50 and 51. With this arrangement the current output of the filter 54 will be the total of the output currents of the switching circuits 45 and 45A.

A single triangular wave voltage generator 20 is preferably used for all of the watt current circuits and enables all of the current outputs to be calibrated by the single calibrating control R17.

What is claimed and is desired to be secured by United States Letters Patent is as follows:

1. A transducer comprising a first input means for energization with the voltage quantity component of the quantity to be measured, a second input means for energization with the current quantity component of the quantity to be measured, a plurality of operational amplifiers, each said amplifier having a positive and a negative input terminal and an output terminal, a plurality of inverters, each said inverter having an output terminal and an input terminal and effective to provide first and second control quantities depending upon the relative magnitudes of an input quantity supplied to its said input terminal and the magnitude of a base quantity, an electronic switching device, a precision wave generator having an output circuit, said generator including a first and a second of said amplifiers and a first of said inverters, said output terminal of said first amplifier being connected to said input terminal of said first inverter, said output terminal of said first inverter being connected to a first of said input terminals of said second amplifier, said output terminal of said second amplifier being connected to said output circuit of said generator and being connected to one of its said input terminals through an impedance device and being connected to a first of said input terminals of said first amplifier through a second impedance device, said output terminal of said first inverter being connected to one of said input terminals of said first amplifier through a third impedance device, said switching device having a pair of output terminals and a pair of input terminals and first and second pairs of gating devices, each of said pairs of said gating devices being operable to connect said pair of input terminals of said switching device with said pair of output terminals of said switching device, first network means energized by said output quantities of said generator and one of said input means to provide a combined output quantity, means connecting said first network means to said input terminal of a second of said inverters, said switching device including switch control means for actuating said pairs of gating devices, second network means connecting said output terminal of said second inverter to said switch control means and effective to open said first or said second pair of gating devices depending upon which one of said first and said second control quantities is provided by said second inverter, means connecting the other of said input means to said pair of input terminals of said switching device, and an integrating network connected to said pair of output terminals of said switching device.

2. The transducer of claim 1 which includes a third of said amplifiers, an output circuit means for said transducer, said integrating network having a pair of output terminals, means connecting said pair of output terminals of said integrating network across said input terminals of said third amplifier, said output means being connected across said output terminals of said integrating network through said output terminal of said third amplifier, said one input means being said second input means.

3. The transducer of claim 2 in which said first and said one input terminals of said second amplifier are its said negative terminal, said first and said one terminals of said first amplifier is its said negative terminal.

4. The transducer of claim 1 in which said switching device is a CMOS quad bilateral switch, said second network including first and second switching controlling circuits connected between said output terminal of said second inverter and said switch control means, said switch control means being effective to connect said first controlling circuit to said first pair of gating devices and said second controlling circuit to said second pair of gating devices, said switch control means being effective when said first controlling circuit is actuated in response to the occurrence of one of said first and second control quantities of said second inverter, said second switch controlling circuit including a third inverter whereby said switch control means is effective when said second controlling circuit is actuated in response to the occurrence of the other of said first and second control quantities of said second inverter.

5. A transducer comprising first and second input means for energization by the voltage and the current components of the quantity to be measured, a triangular wave voltage generator, a voltage mixing circuit means connected to said first input means and to said generator and having an output quantity which is a combination of the output quantities of said first input means and said generator, a voltage comparator network having an output and having an input connected to said mixing circuit means, said comparator network being effective to provide at its said output logical 1 and logical 0 output quantities depending upon the relative magnitudes of said output quantity and a predetermined quantity, an integrating output network having input terminals, a switching device having input and output pairs of terminals and first and second paths interconnecting its said pairs of terminals, each said path including switching means controlled by an actuator between open and closed conditions, circuit means connecting said pair of output terminals to said integrating output network, circuit means connecting said pair of input terminals to said second input means, and network means connecting said output of said comparator to said actuators of said switching means, said actuators being effective to close its said switching means as a consequence of the occurrence of said logical 1 signal and to close the other of its said switching means as a consequence of the occurrence of said logical 0 signal.

6. The transducer of claim 5 in which said network means includes a second inverter actuated by said comparator network and a third inverter actuated by said second inverter, said network means having a first circuit connected between said second inverter and said actuator of one of said switching means, said actuator of said one switching means being effective to close said one switching means as a consequence of a logical 1 signal at the output of said second inverter, said network means having a second circuit connected between the output of said third inverter and said actuator of the other of said switching means, said actuator of said other switching means being effective to close its said other switching means as a consequence of a logical 1 signal at the output of said third inverter.

7. A solid state watt transducer for measuring the power flowing in an electric circuit comprising, a first input circuit adapted to be energized with a first quantity proportional to the current quantity of said power, a second input circuit adapted to be energized with a second quantity proportional to the voltage quantity of said power, a triangular wave generator including calibrating means which determines the magnitude of the triangular wave generated by said generator, a summing network having a pair of inputs, one of said inputs being energized by said first quantity and the other said inputs being energized by said triangular wave, said summing network being effective to provide an output quantity proportional to the sum of the quantities at its said inputs, a comparator having an input energized by said output quantity of said summing network, said comparator having an output energized when said output quantity of said summing network is of a first polarity, a plurality of electronic switches, each said switch having a main circuit and a control circuit for controlling the conductive condition of its associated said main circuit, circuit means connecting said main circuits into a bridge circuit configuration having a pair of input terminals and a pair of output terminals, a first of said pair of input terminals being the common connection of said main circuits of a first and a second of said electronic switches, a second of said input pair of terminals being the common connection of said main circuits of a third and a fourth of said electronic switches, a first of said pair of output terminals being the common connection of said main circuits of said first and fourth electronic switches, a second of said pair of output terminals being the common connection of said main circuits of said second and third electronic switches, said comparator including a switch controlling network connecting said control circuits of said switches to said comparator, said switch controlling network being effective at one operating condition of said comparator to render said main circuit of said first and said third switches conductive and at a second operating condition of said comparator to render said main circuits of said second and said fourth switches conductive, means connecting said pair of input terminal of said bridge circuit to said first input circuit for energization of said current quantity, a low pass filter having an output and an input, said output of said filter being connected to said pair of output terminals of said bridge circuit, and a transducer output circuit operatively connected to and energized from said output of said filter.

8. The transducer of claim 8 in which said transducer output circuit includes a current amplifier.

9. The transducer of claim 7 in which said filter blocks the passage of all of the harmonics of said voltage of said power to be measured.

10. The transducer of claim 7 in which said triangular wave generator comprises first and second operational amplifiers and an inverter, said inverter having an input connected to the output of said first operational amplifier and its output connected to one input terminal of said second amplifier.

11. The transducer of claim 10 in which a first resistive means is connected between one input terminal of said first operational amplifier and said output of said inverter, a second resistive means is connected between said output of said inverter and said one input terminal of said second amplifier, a third resistive means is connected between the output of said second amplifier and said one input terminal of said first amplifier, a first capacitive means connected between the output terminal and said one input terminal of said second amplifier, one of said resistive means including means to change the magnitude of its resistance whereby to change the magnitude of the current in said transducer output circuit.

12. The transducer of claim 11 in which said transducer output circuit includes a current amplifier network, said current amplifier network including a third operational amplifier having its input terminals connected across said output of said filter, said transducer output circuit further including a circuit extending between one of said input terminals and the output terminal of said third transducer.

13. The transducer of claim 12 in which said one terminals are negative terminals.

14. The transducer of claim 7 in which said comparator comprises three inverters each having an input terminal and an output signal terminal and a pair of voltage input terminals, a pair of voltage supplying conductors, a first of said voltage conductors having a positive potential with respect to a neutral bus, a second of said voltage conductors having a negative potential with respect to said neutral bus, circuit means connecting said voltage input buses between said voltage conductors, said last-named circuit means including circuit limiting means in series with said voltage input terminals of a first of said three inverters of said comparator, said input terminal of said first-named first inverter being connected to said summing network, said output terminal of said just-named first inverter being connected to said input terminal of a second of said third inverter of said comparator, said output terminal of said just-named second inverter being connected to said input terminal of a third of said three inverters of said comparator and to one of said switch controlling networks, said output of said just-named third inverter being connected to the other of said switch controlling network.

15. The transducer of claim 14 in which said current limiting means comprises a pair of resistors of unequal magnitude, one of said resistors being connected between one of said voltage conductors and one of said voltage input terminals of said first inverter of said comparator, the other of said resistors being connected between the other of said voltage conductors and the other of said voltage input terminals of said first inverter of said comparator.

16. The transducer of claim 15 in which said third inverter of said comparator is a CMOS-CD4007AE type integrated circuit and said four switches is a COMOS-CD4016AE type integrated circuit.

* * * * *